US009349983B2

(12) United States Patent
Cho et al.

(10) Patent No.: US 9,349,983 B2
(45) Date of Patent: May 24, 2016

(54) DISPLAY PANEL AND ORGANIC LIGHT EMITTING DISPLAY DEVICE COMPRISING THE SAME

(71) Applicant: SAMSUNG DISPLAY CO., LTD., Yongin, Gyeonggi-Do (KR)

(72) Inventors: Sung-Ho Cho, Seoul (KR); Jin-Suk Park, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/284,191

(22) Filed: May 21, 2014

(65) Prior Publication Data

US 2015/0060789 A1 Mar. 5, 2015

(30) Foreign Application Priority Data

Sep. 3, 2013 (KR) ........................ 10-2013-0105288

(51) Int. Cl.
*H01L 51/52* (2006.01)
*H01L 27/32* (2006.01)

(52) U.S. Cl.
CPC ........ *H01L 51/5234* (2013.01); *H01L 51/5246* (2013.01); *H01L 27/3244* (2013.01)

(58) Field of Classification Search
CPC .......................... H01L 27/153; H01L 27/3241
See application file for complete search history.

(56) References Cited

U.S. PATENT DOCUMENTS

| 7,462,931 | B2 * | 12/2008 | Summers ...................... 257/704 |
| 2006/0250083 | A1 * | 11/2006 | Oh et al. ........................ 313/512 |
| 2007/0048898 | A1 * | 3/2007 | Carlson et al. ................ 438/106 |
| 2010/0079065 | A1 * | 4/2010 | Kamiura ....................... 313/504 |
| 2012/0146493 | A1 | 6/2012 | Ra |

FOREIGN PATENT DOCUMENTS

| KR | 10-2011-0035444 A | 4/2011 |
| KR | 10-2011-0041321 A | 4/2011 |
| KR | 10-2011-0119428 A | 11/2011 |

OTHER PUBLICATIONS

English translation of KR 10-2011-0041321.*

* cited by examiner

*Primary Examiner* — John C Ingham
(74) *Attorney, Agent, or Firm* — Lewis Roca Rothgerber Christie LLP (57) ABSTRACT

A display panel including: a first substrate; a second substrate opposing the first substrate; a sealing substructure on the first substrate, the sealing substructure surrounding a display unit having a plurality of pixels, the sealing substructure including a metal mesh layer having a mesh shape; and a sealing member between the sealing substructure and the second substrate to seal between the first substrate and the second substrate.

19 Claims, 6 Drawing Sheets

DISPLAY PANEL AND ORGANIC LIGHT EMITTING DISPLAY DEVICE COMPRISING THE SAME

CROSS REFERENCE TO RELATED APPLICATION

This application claims priority to and the benefit of Korean Patent Application No. 10-2013-0105288, filed on Sep. 3, 2013 in the Korean Intellectual Property Office, the entire content of which is incorporated herein by reference.

BACKGROUND

1. Field

Aspects of embodiments of the present invention relate to display devices, display panels, and organic light emitting display devices including display panels.

2. Description of the Related Art

An organic light emitting diode (OLED) is sensitive to moisture and gas. Thus, when the OLED is exposed to moisture and/or gas, a characteristic of the OLED may be deteriorated, and the life span of the OLED may be shortened. Therefore, techniques that can isolate the OLED from an external environment including moisture and/or gas have been studied recently.

The OLED in a display device can be isolated from the external environment using a sealing member (e.g., a frit). Since a cavity of the frit is smaller than a water molecule, the display device that is sealed by the frit can be isolated from the moisture to prevent the deterioration of the OLED. However, the display device sealed by the frit has low peel strength due to low adhesion between the frit and a substrate.

SUMMARY

According to an aspect of embodiments of the present invention, a display panel is capable of preventing or substantially preventing separation of a substrate.

According to another aspect of embodiments of the present invention, an organic light emitting display device includes a display panel having enhanced peel strength.

According to one or more embodiments of the present invention, a display panel includes: a first substrate; a second substrate opposing the first substrate; a sealing substructure on the first substrate; the sealing substructure surrounding a display unit having a plurality of pixels, the sealing substructure including a metal mesh layer having a mesh shape; and a sealing member between the sealing substructure and the second substrate to seal between the first substrate and the second substrate.

In one or more embodiments, the sealing substructure may further include a first insulation layer on the first substrate, a first metal layer on the first insulation layer, the first metal layer including a same material as a gate electrode in the display unit, and a second insulation layer on the first metal layer. The metal mesh layer may be on the second insulation layer.

In one or more embodiments, the metal mesh layer may include a second metal layer including a same material as a source electrode or a drain electrode in the display unit, and a third metal layer on the second metal layer, the third metal layer including a same material as at least one of an anode electrode or a cathode electrode in the display unit.

In one or more embodiments, at least a portion of the metal mesh layer may be connected to the first metal layer.

In one or more embodiments, at least one of the first insulation layer, the first metal layer, or the second insulation layer may have the mesh shape.

In one or more embodiments, at least one of the first insulation layer, the first metal layer, the second insulation layer, or the metal mesh layer may have a step difference.

In one or more embodiments, the first metal layer may include at least one material selected from the group consisting of aluminum (Al), molybdenum (Mo), chromium (Cr), tungsten (W), copper (Cu), gold (Au), silver (Ag), and nickel (Ni).

In one or more embodiments, the metal mesh layer may be spaced apart from an edge of the first metal layer by a distance.

In one or more embodiments, the first insulation layer may include a first layer including a same material as a buffer layer in the display unit, and a second layer including a same material as a gate insulation layer in the display unit.

In one or more embodiments, a line width of the mesh shape may be about 3 μm to about 10 μm.

In one or more embodiments, a line spacing of the mesh shape may be about 3 μm to about 10 μm.

In one or more embodiments, the metal mesh layer may include a second metal layer that includes a same material as at least one of a source electrode or a drain electrode in the display unit.

In one or more embodiments, the second metal layer may include at least one material selected from the group consisting of aluminum, molybdenum, chromium, tungsten, copper, gold, silver, and nickel.

In one or more embodiments, a thickness of the second metal layer may be about 0.3 μm to about 0.7 μm.

In one or more embodiments, the metal mesh layer may include a third metal layer that includes a same material as at least one of an anode electrode or a cathode electrode in the display unit.

In one or more embodiments, the third metal layer may include at least one material selected from the group consisting of indium tin oxide (ITO), indium zinc oxide (IZO), and silver.

In one or more embodiments, a thickness of the third metal layer may be about 0.1 μm to about 0.5 μm.

According to one or more embodiments of the present invention, an organic light emitting display device includes: a display panel having a plurality of pixels, a scan driving unit configured to provide a scan signal to the pixels, a data driving unit configured to provide a data signal to the pixels, and a timing control unit configured to control the scan driving unit and the data driving unit, and the display panel includes: a first substrate; a second substrate opposing the first substrate; a sealing substructure on the first substrate, the sealing substructure surrounding the pixels; and a sealing member between the sealing substructure and the second substrate to seal between the first substrate and the second substrate, the sealing substructure including: a first insulation layer on the first substrate; a first metal layer on the first insulation layer, the first metal layer including a same material as a gate electrode in a display unit having the plurality of pixels; a second insulation layer on the first metal layer; and a metal mesh layer on the second insulation layer, the metal mesh layer having a mesh shape.

In one or more embodiments, the metal mesh layer may include: a second metal layer including a same material as at least one of a source electrode or a drain electrode in the display unit; and a third metal layer on the second metal layer, the third metal layer including a same material as at least one of an anode electrode or a cathode electrode in the display unit.

In one or more embodiments, at least one of the first insulation layer, the first metal layer, or the second insulation layer may have the mesh shape.

According to an aspect of embodiments of the present invention, a display panel has enhanced adhesion between a sealing member and a substrate due to a metal mesh layer that can also improve thermal conductivity and light efficiency.

According to another aspect of embodiments of the present invention, since the display panel has enhanced peel strength, an organic light emitting display device having the display panel may have an increased life span while maintaining high performance.

BRIEF DESCRIPTION OF THE DRAWINGS

Some exemplary embodiments of the present invention are described in further detail herein in conjunction with the accompanying drawings, in which.

DETAILED DESCRIPTION

Some exemplary embodiments of the present invention are described more fully hereinafter with reference to the accompanying drawings. As those skilled in the art would realize, the described embodiments may be modified in various different ways, all without departing from the spirit or scope of the present invention. Accordingly, the drawings and description are to be regarded as illustrative in nature and not restrictive. In the drawings, the sizes and relative sizes of layers and regions may be exaggerated for clarity. Like or similar reference numerals refer to like or similar elements throughout.

It is to be understood that when an element or layer is referred to as being "on," "connected to," or "coupled to" another element or layer, it may be directly on, connected, or coupled to the other element or layer, or one or more intervening elements or layers may be present. In contrast, when an element is referred to as being "directly on," "directly connected to," or "directly coupled to" another element or layer, it is to be understood that there are no intervening elements or layers present. As used herein, the term "and/or" includes any and all combinations of one or more of the associated listed items.

It is to be understood that, although the terms "first," "second," "third," etc. may be used herein to describe various elements, components, regions, layers, patterns, and/or sections, these elements, components, regions, layers, patterns, and/or sections are not limited by these terms. These terms are used merely to distinguish one element, component, region, layer, pattern, or section from another element, component, region, layer, pattern, or section. Thus, a first element, component, region, layer, pattern, or section discussed below could be termed a second element, component, region, layer, pattern, or section without departing from the teachings of the embodiments of the present invention.

Spatially relative terms, such as "beneath," "below," "lower," "above," "upper," and the like, may be used herein for purposes of description to describe one element or feature's relationship to another element(s) or feature(s) as illustrated in the drawings. It is to be understood that the spatially relative terms are intended to encompass different orientations of the device in use or operation in addition to the orientation depicted in the drawings. For example, if the device in the figures is turned over, elements described as "below" or "beneath" other elements or features would then be oriented "above" the other elements or features. Thus, for example, the term "below" can encompass both an orientation of above and below. The device may be otherwise oriented (e.g., rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an," and "the" are intended to include the plural forms as well, unless the context clearly indicates otherwise. It is to be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Some exemplary embodiments are described herein with reference to cross-sectional illustrations that are schematic illustrations of illustrative exemplary embodiments (and intermediate structures) of the inventive concept. As such, variations from the shapes of the illustrations as a result, for example, of manufacturing techniques and/or tolerances, are to be expected. Thus, the exemplary embodiments shown and described herein are not be construed as limited to the particular shapes of regions illustrated herein but are to include deviations in shapes that result, for example, from manufacturing. The regions illustrated in the drawings are schematic in nature and their shapes are not necessarily intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
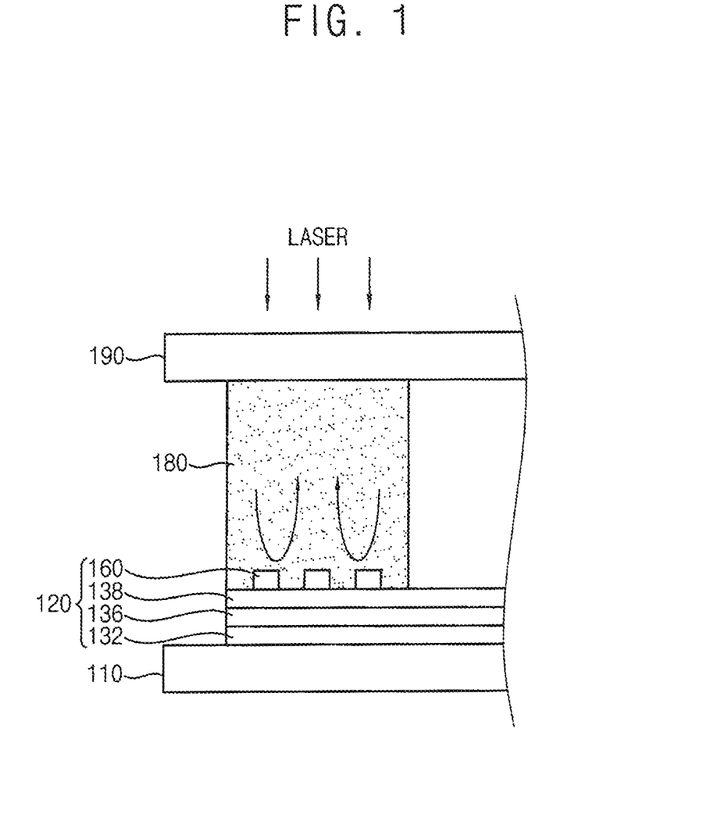
FIG. 1 is a schematic cross-sectional view illustrating a sealing portion of a display panel, according to an embodiment of the present invention.

FIG. 1 is a schematic cross-sectional view illustrating a sealing portion of a display panel, according to an embodiment of the present invention.

Referring to FIG. 1, the display panel may include a first substrate 110, a sealing substructure 120, a sealing member 180, and a second substrate 190. The sealing substructure 120 may include a metal mesh layer 160 having a mesh shape.

The sealing member 180 seals between the first substrate 110 and the second substrate 190 to isolate the display panel from the external environment, including moisture and gas. The sealing member 180, in one embodiment, for example, may be frit.

The sealing substructure 120, in one embodiment, may include a first insulation layer 132, a first metal layer 136, a second insulation layer 138, and the metal mesh layer 160. The first insulation layer 132 may be disposed on the first substrate 110. The first insulation layer 132 may include a first layer having a same material as a buffer layer in a display unit, and a second layer having a same material as a gate insulation layer in the display unit. The first metal layer 136 may be disposed on the first insulation layer 132. The first metal layer 136 may have a same material as a gate electrode in the display unit. The second insulation layer 138 may be disposed on the first metal layer 136. The second insulation layer 138 may have a same material as an inter-layer dielectric (ILD) in the display unit. The metal mesh layer 160 may include a second metal layer having a same material as a source electrode or a drain electrode in the display unit, and/or a third metal layer having a same material as an anode electrode or a cathode electrode in the display unit.

The metal mesh layer 160 may have the mesh shape, and thus the metal mesh layer 160 can widen a contact area between the sealing substructure 120 and the sealing member 180. In addition, since the metal mesh layer 160 has high thermal conductivity and high light efficiency, the metal mesh layer 160 helps the sealing portion of the display panel to absorb the laser energy. Therefore, when the laser is irradiated on the sealing portion of the display panel, the sealing member 180 can efficiently absorb the laser energy due to the metal mesh layer 160. The display panel including the metal mesh layer 160 can enhance adhesion between the sealing member 180 and the first and second substrates 110 and 190, thereby preventing or substantially preventing the separation of the first substrate 110 and the second substrate 190.

Figure 2:
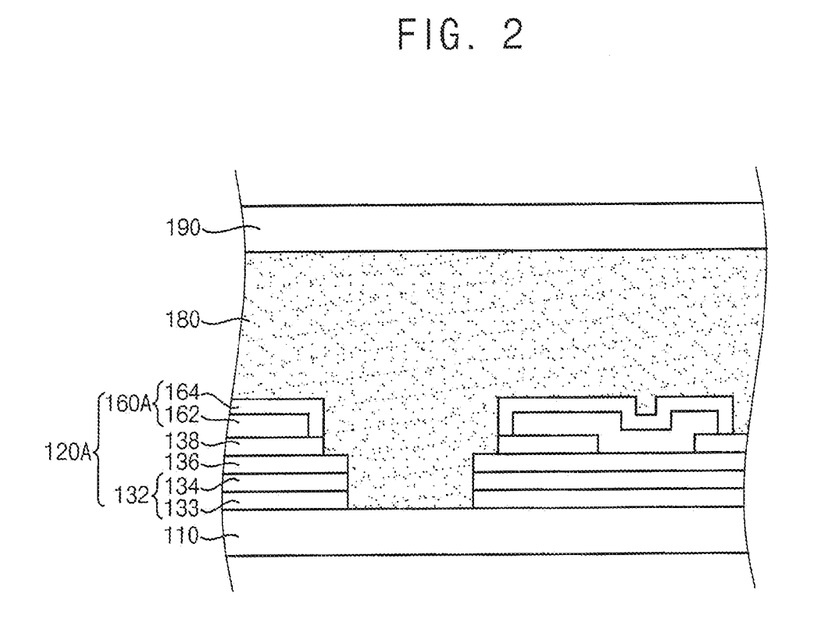
FIG. 2 is a cross-sectional view illustrating a sealing portion of a display panel, according to an embodiment of the present invention.

FIG. 2 is a cross-sectional view illustrating a sealing portion of a display panel, according to an embodiment of the present invention.

Referring to FIG. 2, at the sealing portion, the display panel may include a first substrate 110, a sealing substructure 120A, a sealing member 180 and a second substrate 190.

One of the first substrate 110 or the second substrate 190 may be a base substrate, and the other of the first substrate 110 or the second substrate 190 may be an encapsulation substrate. The first substrate 110 or the second substrate 190 may include a transparent insulation substrate. For example, the first substrate 110 or the second substrate 190 may include a glass substrate, a quartz substrate, or a transparent resin substrate, etc. The transparent resin substrate may include polyamide resin, acryl resin, polyacrylate resin, polycarbonate resin, polyether resin, polyethylene terephthalate resin, or sulfonic acid resin, etc.

The sealing member 180 may surround a display unit having a plurality of pixels to isolate the display unit from an external environment including moisture and gas. To achieve the isolation, the sealing member 180 may include a material that can effectively prevent penetration of moisture or gas without the need for an absorbent material. For example, the sealing member 180 may contain an inorganic material such as frit, but is not limited thereto. The sealing member 180 may be melted by laser irradiation, and may be hardened for sealing between the first substrate 110 and the second substrate 190. In one or more embodiments, a cross-section of the sealing portion having the sealing member 180 may be formed having a trapezoidal shape to increase a sealing effect.

The sealing substructure 120A, in one embodiment, may include the first insulation layer 132, the first metal layer 136, the second insulation layer 138, and a metal mesh layer 160A.

The first insulation layer 132 may be disposed on the first substrate 110. In one or more embodiments, the first insulation layer 132 may have a multi-layer structure. For example, the first insulation layer 132 may include a first layer having a same material as a buffer layer in the display unit, and a second layer having a same material as a gate insulation layer in the display unit. The first insulation layer 132 having the multi-layer structure can widen a contact area between the sealing substructure 120A and the sealing member 180. The first insulation layer 132 may include a same material as a buffer layer, such as silicon oxide (SiOx), aluminum oxide (AlOx), hafnium oxide (HfOx), etc. The first insulation layer 132 may alternatively or further include a same material as a gate insulation layer, such as silicon oxide (SiOx), aluminum oxide (AlOx), zirconium oxide (ZrOx), etc. In one embodiment, the first insulation layer 132 may further include additional layers to further widen the contact area between the sealing substructure 120A and the sealing member 180.

The first metal layer 136 may be disposed on the first insulation layer 132. The first metal layer 136, in one embodiment, may be formed concurrently (e.g., simultaneously) with a gate electrode in the display unit, and may have a same material as the gate electrode. In one or more embodiments, the first metal layer 136 may include at least one material selected from the group consisting of aluminum (Al), molybdenum (Mo), chromium (Cr), tungsten (W), copper (Cu), gold (Au), silver (Ag), and nickel (Ni).

The second insulation layer 138 may be disposed on the first metal layer 136. The second insulation layer 138 may be formed concurrently (e.g., simultaneously) with an inter-layer dielectric in the display unit that can insulate the gate electrode from the source electrode and the drain electrode. Thus, the second insulation layer 138 may have a same material as the inter-layer dielectric. The second insulation layer 138 may be formed using a silicon compound such as silicon oxide (SiOx), silicon nitride (SiNx), silicon oxynitride (SiOxNy), silicon oxycarbide (SiOxCy), silicon carbon nitride (SiCxNy), etc. In one or more embodiments, the second insulation layer 138 may have a contact hole for contacting the metal mesh layer 160A to the first metal layer 136.

The metal mesh layer 160A may be disposed on the second insulation layer 138. The metal mesh layer 160A, in one embodiment, may include a second metal layer 162 having a same material as a source electrode or a drain electrode in the display unit, and a third metal layer 164 disposed on the second metal layer 162. The third metal layer 164 may have a same material as an anode electrode or a cathode electrode in the display unit. In one or more embodiments, at least a portion of the metal mesh layer 160A is connected to the first metal layer 136. An electrostatic charge that is generated during a manufacturing process of the display panel may be distributed to the first metal layer 136 by contacting the metal mesh layer 160A to the first metal layer 136 for preventing or substantially preventing defects generated by the electrostatic charge. The second metal layer 162 may be disposed on the second insulation layer 138. The second metal layer 162 may have the mesh shape to improve thermal conductivity and light efficiency. The second metal layer 162 may be formed concurrently (e.g., simultaneously) with a source electrode or a drain electrode in the display unit and may have a same material as the source electrode or the drain electrode. The second metal layer 162 may be formed using a metal that has high thermal conductivity and high light reflectivity. In one or more embodiments, the second metal layer 162 may include at least one material selected from the group consisting of aluminum, molybdenum, chromium, tungsten, copper, gold, silver, and nickel. In one or more embodiments, a thickness of the second metal layer 162 may be about 0.3 μm to about 0.7 μm. In one or more embodiments, since the second metal layer 162 may be formed concurrently (e.g., simultaneously) with the source electrode or the drain electrode, the thickness of the second metal layer 162 may be the same as a thickness of the source electrode or the drain electrode. In other embodiments, the thickness of the second metal layer 162 may be different from the thickness of the source electrode or the drain electrode. In one or more embodiments, to provide the large contact area between the sealing substructure 120A and the sealing member 180, the thickness of the second metal layer 162 may be greater than 0.5 μm. The third metal layer 164 may be disposed on the second metal layer 162. The third metal layer 164 may have the mesh shape to improve thermal conductivity and light efficiency. The third metal layer 164 may be formed concurrently (e.g., simultaneously) with an anode electrode or a cathode electrode in the display unit and may have a same material as the anode electrode or the cathode electrode. The third metal layer 164 may be formed using a metal having high thermal conductivity and high light reflectivity. In one or more embodiments, the third metal layer 164 may include at least one material selected from the group consisting of indium tin oxide (ITO), indium zinc oxide (IZO), and silver. In one or more embodiments, a thickness of the third metal layer 164 may be about 0.1 μm to about 0.5 μm. In one or more embodiments, since the third metal layer 164 may be formed concurrently (e.g., simultaneously) with the anode electrode or the cathode electrode, the thickness of the third metal layer 164 may be the same as a thickness of the anode electrode or the cathode electrode. In other embodiments, the thickness of the third metal layer 164 may be different from the thickness of the cathode anode or the cathode electrode. In one or more embodiments, to provide a large contact area between the sealing substructure 120A and the sealing member 180, the thickness of the third metal layer 164 may be greater than 0.1 μm. In one or more embodiments, the second metal layer 162 may be covered by the third metal layer 164 such that the second metal layer 162 may not be damaged during an etching process for the third metal layer 164.

The sealing substructure 120A may have various structures for widening the contact area between the sealing substructure 120A and the sealing member 180. In one or more embodiments, at least one of the first insulation layer 132, the first metal layer 136, or the second insulation layer 138 may also have the mesh shape. In one embodiment, the first insulation layer 132, the first metal layer 136, and the second insulation layer 138 have the mesh shape, and the contact area may be further widened, and the adhesion between the sealing member 180 and the first substrate 110 may be further enhanced. In one or more embodiments, to provide a large contact area between the sealing substructure 120A and the sealing member 180, the height of the mesh shape may be greater than 1.7 μm. In one or more embodiments, at least one of the first insulation layer 132, the first metal layer 136, the second insulation layer 138, or the metal mesh layer 160A may have a step difference. For example, if the sealing substructure 120A has a step type structure, damage generated during an etching process can be reduced, and the contact area between the sealing substructure 120A and the sealing member 180 can be further widened.

Figure 3:
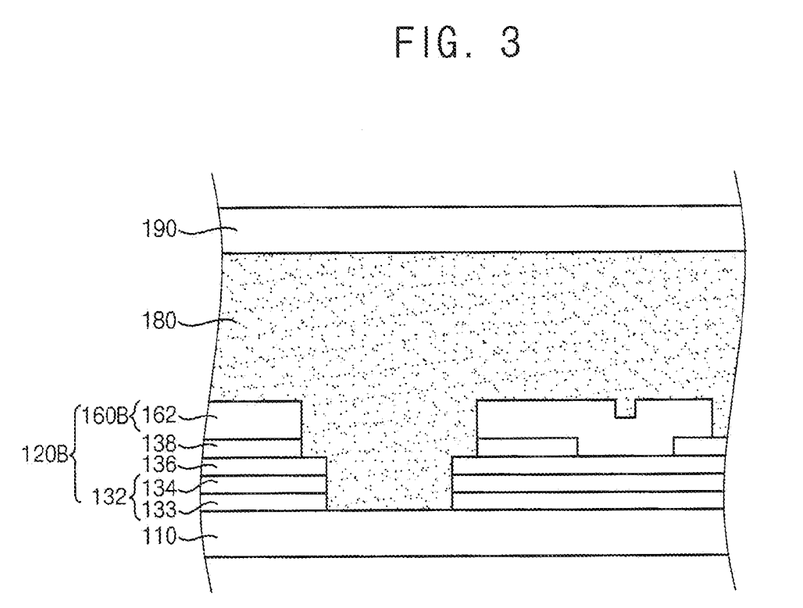
FIG. 3 is a cross-sectional view illustrating a sealing portion of a display panel, according to another embodiment of the present invention.

FIG. 3 is a cross-sectional view illustrating a sealing portion of a display panel, according to another embodiment of the present invention.

Referring to FIG. 3, a sealing substructure 120B according to another embodiment of the present invention includes a first insulation layer 132, a first metal layer 136, a second insulation layer 138, and a metal mesh layer 160B. The metal mesh layer 160B may include a second metal layer 162. The second metal layer 162 may be formed concurrently (e.g., simultaneously) with a source electrode or a drain electrode in the display unit, and may include a same material as the source electrode or the drain electrode. The second metal layer 162 may be formed using a metal that has high thermal conductivity and light reflectivity. In one or more embodiments, the second metal layer 162 may include at least one material selected from the group consisting of aluminum, molybdenum, chromium, tungsten, copper, gold, silver, and nickel. In one or more embodiments, a thickness of the second metal layer 162 may be about 0.3 μm to about 0.7 μm. In one or more embodiments, the second metal layer 162 may be formed concurrently (e.g., simultaneously) with the source electrode or the drain electrode, and the thickness of the second metal layer 162 may be the same as a thickness of the source electrode or the drain electrode. In other embodiments, the thickness of the second metal layer 162 may be different from the thickness of the source electrode or the drain electrode. In one embodiment, to provide a large contact area between the sealing substructure 120B and the sealing member 180, the thickness of the second metal layer 162 may be greater than 0.5 μm.

At the sealing portion, the display panel may further include the first substrate 110, the sealing member 180, and the second substrate 190 as well as the sealing substructure 120B. Since these are described above, descriptions thereof will not be repeated.

Figure 4:
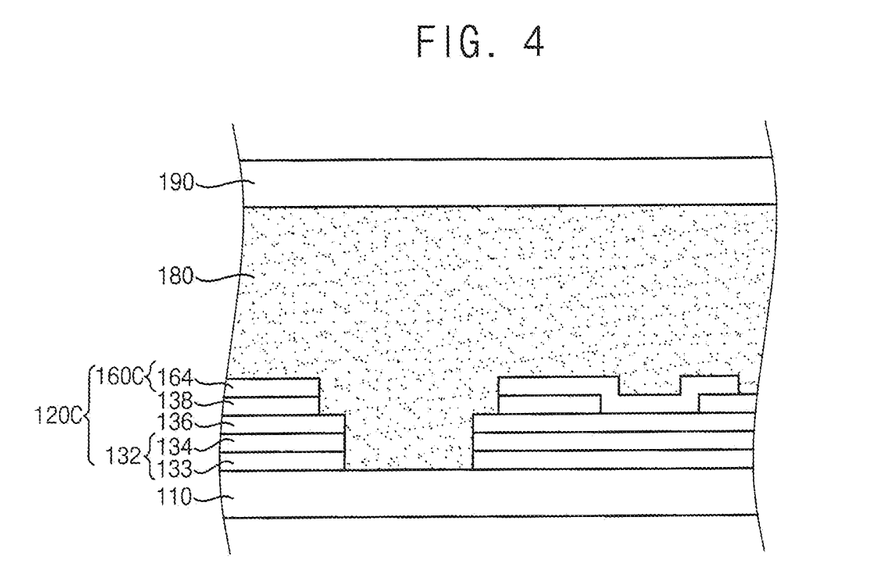
FIG. 4 is a cross-sectional view illustrating a sealing portion of a display panel, according to another embodiment of the present invention.

FIG. 4 is a cross-sectional view illustrating a sealing portion of a display panel, according to another embodiment of the present invention.

Referring to FIG. 4, a sealing substructure 120C according to another embodiment of the present invention may include a first insulation layer 132, a first metal layer 136, a second insulation layer 138, and a metal mesh layer 160C. The metal mesh layer 160C may include a third metal layer 164. The third metal layer 164 may be formed concurrently (e.g., simultaneously) with an anode electrode or a cathode electrode in the display unit and may include a same material as the anode electrode or the cathode electrode. The third metal layer 164 may be formed using a metal that has high thermal conductivity and high light reflectivity. In one embodiment, the third metal layer 164 may include at least one material selected from the group consisting of indium tin oxide (ITO), indium zinc oxide (IZO), and silver. In one or more embodiments, a thickness of the third metal layer 164 may be about 0.1 μm to about 0.5 μm. In one embodiment, the third metal layer 164 may be formed concurrently (e.g., simultaneously) with the anode electrode or the cathode electrode, and the thickness of the third metal layer 164 may be the same as a thickness of the anode electrode or the cathode electrode. In other embodiments, the thickness of the third metal layer 164 may be different from the thickness of the anode electrode or the cathode electrode. In one embodiment, to provide a large contact area between the sealing substructure 120C and the sealing member 180, the thickness of the third metal layer 164 may be greater than 0.1 µm.

At the sealing portion, the display panel may further include the first substrate 110, the sealing member 180, and the second substrate 190 as well as the sealing substructure 120C. Since these are described above, description thereof will not be repeated.

Figure 5:
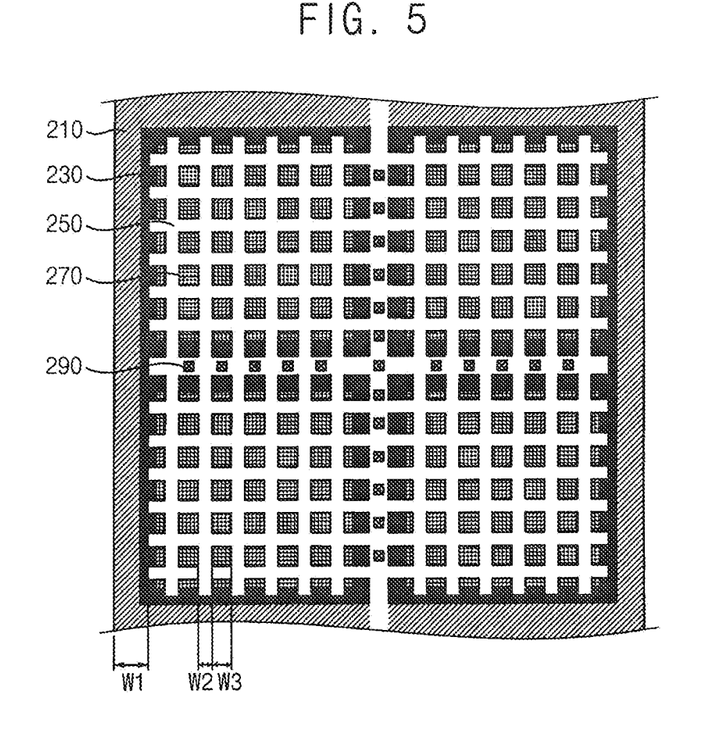
FIG. 5 is a top view illustrating a sealing portion of a display panel, according to an embodiment of the present invention.

FIG. 5 is a top view illustrating a sealing portion of a display panel, according to an embodiment of the present invention.

Referring to FIG. 5, a sealing substructure may include a metal mesh layer having a mesh shape for enhancing adhesion between the sealing member and the substrate. At least a portion of the metal mesh layer is connected to a first metal layer for preventing or substantially preventing defects generated by an electrostatic charge.

According to embodiments of the present invention, the sealing substructure can widen a contact area between the sealing substructure and the sealing member using various methods. In one embodiment, at least one of the first insulation layer, the first metal layer, the second insulation layer, or the metal mesh layer may have a step difference. For example, the first insulation layer may be deposited on a portion of the first substrate, the first metal layer may be disposed on a portion of the first insulation layer, a second insulation layer may be disposed on a portion of the first metal layer, and the metal mesh layer may be disposed on a portion of the second insulation layer in a mesh shape. Therefore, the sealing portion may include a first contact portion 210 of the first metal layer and the sealing member, a second contact portion 230 of the second insulation layer and the sealing member, and a third contact portion 250 of the metal mesh layer and the sealing member. When the second insulation layer is disposed on the first metal layer, or the metal mesh layer is disposed on the second insulation layer, at least one of the layers may have a step difference to widen the contact area between the sealing substructure and the sealing member and to reduce damage generated by an etching process. In one embodiment, at least one of the first insulation layer, the first metal layer, or the second insulation layer may have the mesh shape. A hole 270 may be formed on a portion of the first insulation layer, the first metal layer, and the second insulation layer for forming the mesh shape. The contact area between the sealing substructure and the sealing member can be increased by forming the hole 270, and adhesion between the sealing member and the first substrate may be enhanced. In one or more embodiments, to provide a large contact area between the sealing substructure and the sealing member, the height of the mesh shape may be greater than 1.7 µm for enhancing the adhesion. In one embodiment, the metal mesh layer may be spaced apart from an edge of the first metal layer by a distance (e.g. a predetermined distance) W1. For example, as the metal mesh layer is spaced apart from the edge of the first metal layer by about 100 µm to about 150 µm, at least one of the first insulation layer, the first metal layer, the second insulation layer, or the metal mesh layer may have a step difference. In one embodiment, a line width W2 of the mesh shape is about 3 µm to about 10 µm. In one embodiment, a line spacing W3 of the mesh shape is about 3 µm to about 10 µm. In one embodiment, the line width W2 and the line spacing W3 of the mesh shape may be less than 10 µm for improving thermal conductivity and light efficiency and preventing or substantially preventing damage by laser irradiation.

A connecting portion 290 of the metal mesh layer may be connected to the first metal layer for preventing or substantially preventing defects generated by the electrostatic charge. In one embodiment, for example, the connecting portion 290 of the metal mesh layer may be formed on a centerline of each mesh pattern. An electrostatic charge may be generated during a manufacturing process of the display panel and the electrostatic charge may cause defects of the display panel. When the metal mesh layer is connected to the first metal layer, the defects of the display panel generated by the electrostatic charge are prevented or substantially preventing by distributing the electrostatic charge.

Figure 6:
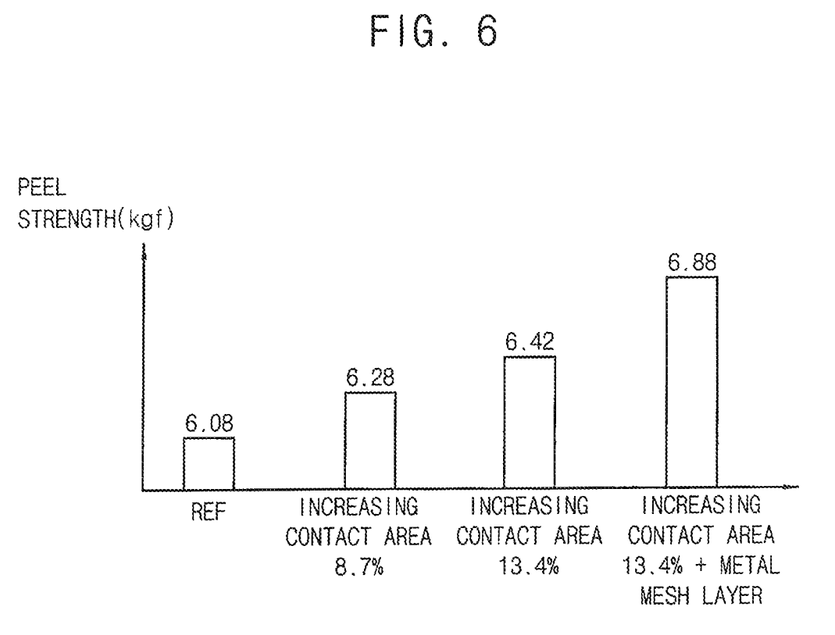
FIG. 6 is a graph illustrating an effect on peel strength of a display panel, according to an embodiment of the present invention.

FIG. 6 is a graph illustrating an effect on peel strength of a display panel, according to an embodiment of the present invention.

Referring to FIG. 6, since the metal mesh layer has the mesh shape, and a contact area between the sealing substructure and the sealing member is widened, the peel strength may be enhanced. According to a reference example, when a first substrate and a second substrate are sealed by a sealing member having frit, the peel strength is about 6.08 kgf. If the contact area is increased by about 8.7%, the peel strength is about 6.28 kgf. If the contact area is increased by about 13.4%, the peel strength is about 6.42 kgf. If the contact area is increased by about 13.4% and the metal mesh layer is formed on the sealing substructure, according to an embodiment of the present invention, the peel strength is about 6.88 kgf, and thermal conductivity and light efficiency are improved. Thus, when the metal mesh layer is formed on the sealing substructure according to an embodiment of the present invention, the peel strength can be increased by about 13%. According to an embodiment of the present invention, the peel strength may be increased by forming the metal mesh layer on the sealing substructure, by forming the step difference among the layers in the sealing substructure, and by forming the holes on a portion of the first insulation layer, the first metal layer, and the second insulation layer.

Figure 7:
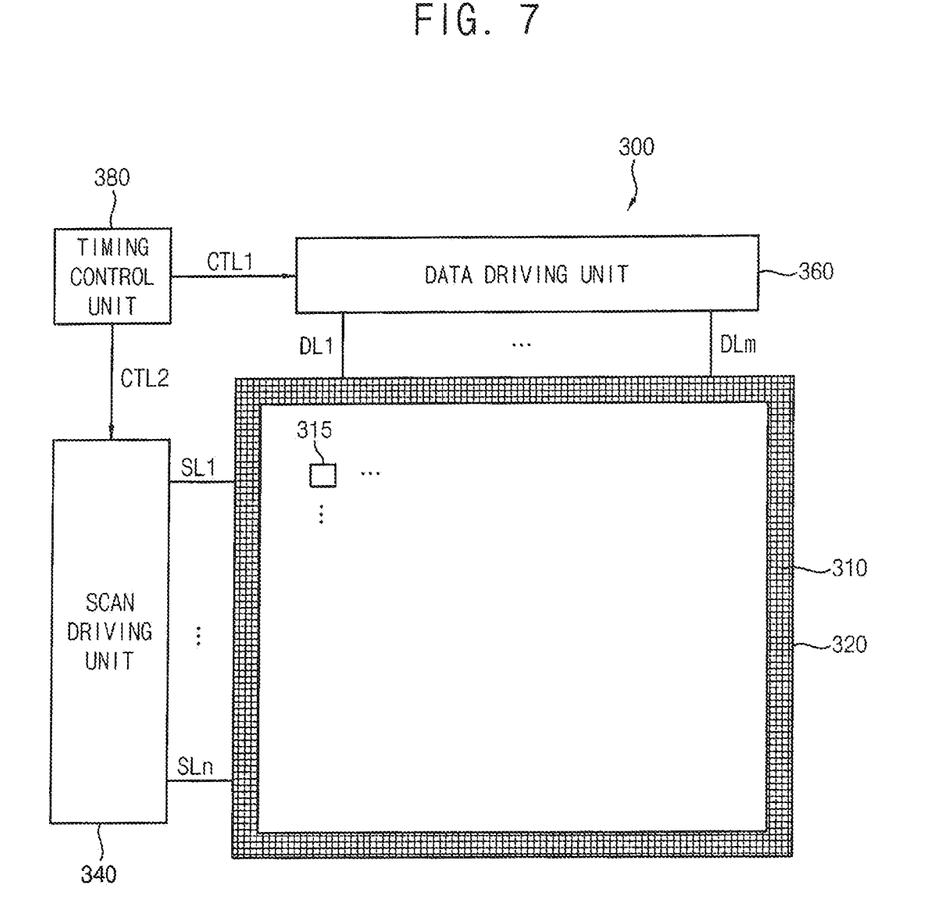
FIG. 7 is a block diagram illustrating an organic light emitting display device, according to an embodiment of the present invention.

FIG. 7 is a block diagram illustrating an organic light emitting display device, according to an embodiment of the present invention.

Referring to FIG. 7, an organic light emitting display device 300 may include a display panel 320, a scan driving unit 340, a data driving unit 360, and a timing control unit 380. In one or more exemplary embodiments, the scan driving unit 340, the data driving unit 360, and the timing control unit 380 may be included in one integrated circuit. In other embodiments, the scan driving unit 340, the data driving unit 360, and the timing control unit 380 may be included in different integrated circuits.

The display panel 320 may include a sealing portion 310. The sealing portion 310 may correspond to one of the sealing portions described above and illustrated in FIGS. 2 to 4 that includes a metal mesh layer. Therefore, the display panel 320 may include a first substrate, a second substrate opposing the first substrate, a sealing substructure disposed on the first substrate, the sealing substructure surrounding the pixels, and a sealing member located between the sealing substructure and the second substrate for sealing between the first substrate and the second substrate. The sealing substructure may include a first insulation layer disposed on the first substrate, a first metal layer disposed on the first insulation layer, the first metal layer including a same material as a gate electrode in a display unit, a second insulation layer disposed on the first metal layer, and a metal mesh layer disposed on the second insulation layer, the metal mesh layer having a mesh shape. In one or more exemplary embodiments, the metal mesh layer may include a second metal layer including a same material as at least one of a source electrode or a drain electrode in the display unit, and/or a third metal layer including a same material as at least one of an anode electrode or a cathode electrode in the display unit. In one or more embodiments, at least one of the first insulation layer, the first metal layer, or the second insulation layer may also have the mesh shape. In one or more embodiments, at least one of the first insulation layer, the first metal layer, the second insulation layer, or the metal mesh layer may have a step difference. In one or more embodiments, the first insulation layer may include a first layer having a same material as a buffer layer in the display unit, and a second layer having a same material as a gate insulation layer in the display unit. Since these are described above, description thereof will not be repeated.

The display panel 320 may include the sealing substructure having the metal mesh layer. The display panel 320 may enhance adhesion between the sealing member and the substrate because the metal mesh layer has high thermal conductivity and high light efficiency. In one or more embodiments, the adhesion can be enhanced more effectively by forming the step difference among the layers that are included in the sealing substructure, and by at least one of the first insulation layer, the first metal layer, and the second insulation layer having the mesh shape. Therefore, the organic light emitting display device 300 may extend the life span while maintaining the performance.

The display panel 320 may be coupled to the scan driving unit 340 via scan lines SL1 through SLn, and may be coupled to the data driving unit 360 via data lines DL1 through DLm. The display panel 320 may include an array of n×m pixels 315 because the pixels 315 are arranged at locations corresponding to crossing points of the scan lines SL1 through SLn and the data lines DL1 through DLm. In one embodiment, when the scan lines SL1 through SLn and the data lines DL1 through DLm are connected to the pixels 315, the sealing substructure is not formed on a portion of the sealing portion that passes the scan lines SL1 through SLn and the data lines DL1 through DLm for driving the display panel 320 without affect.

The scan driving unit 340 may provide a scan signal to the pixels 315 via the scan lines SL1 through SLn. The data driving unit 360 may provide a data signal to the pixels 315 via the data lines DL1 through DLm. The timing control unit 380 may control the scan driving unit 340 and the data driving unit 360, based on control signals (CTL1, CTL2).

Figure 8:
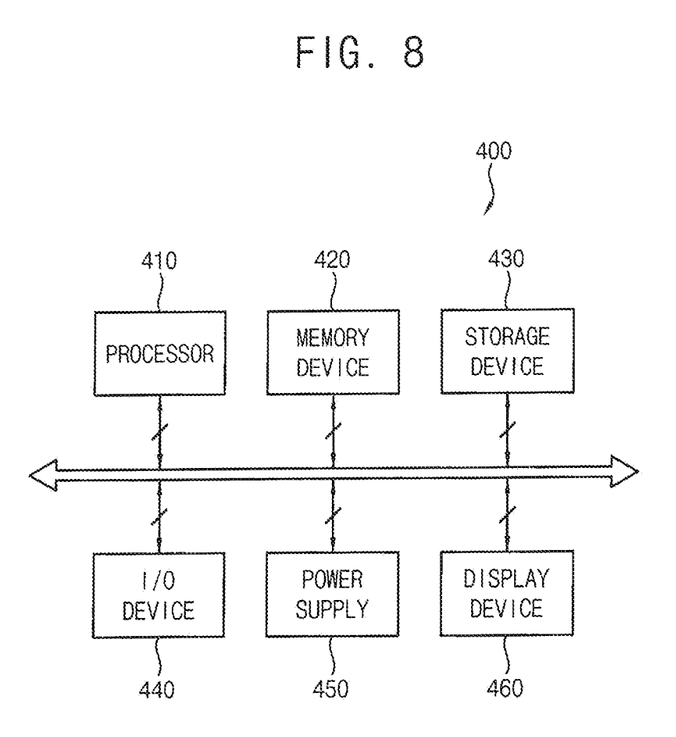
FIG. 8 is a block diagram illustrating an electronic device having an organic light emitting display device, according to an embodiment of the present invention.

FIG. 8 is a block diagram illustrating an electronic device having an organic light emitting display device, according to an embodiment of the present invention.

Referring to FIG. 8, an electronic device 400, in one embodiment, may include a processor 410, a memory device 420, a storage device 430, an input/output (I/O) device 440, a power supply 450, and an organic light emitting display device 460. In one embodiment, the electronic device 400 may further include a plurality of ports for communicating with a video card, a sound card, a memory card, a universal serial bus (USB) device, other electronic devices, etc.

The processor 410 may perform various computing functions. The processor 410 may be a microprocessor, a central processing unit (CPU), etc. The processor 410 may be coupled to other components via an address bus, a control bus, a data bus, etc. Further, the processor 410 may be coupled to an extended bus, such as a peripheral component interconnection (PCI) bus.

The memory device 420 may store data for operations of the electronic device 400. For example, the memory device 420 may include at least one non-volatile memory device, such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc.

The storage device 430 may be a solid state drive (SSD) device, a hard disk drive (HDD) device, a CD-ROM device, etc. The I/O device 440 may be an input device such as a keyboard, a keypad, a touchpad, a touch-screen, a mouse, etc., and/or an output device such as a printer, a speaker, etc. The power supply 450 may provide a power for operations of the electronic device 400. The organic light emitting display device 460 may communicate with other components via the buses or other communication links.

The organic light emitting display device 460 may correspond to the organic light emitting display device of FIG. 7 that may include a display panel according to the present invention, such as the display panel of FIG. 1. Therefore, the organic light emitting display device 460 having the display panel may maintain a performance and have an extended life span.

Embodiments of the present invention may be applied to an electronic device having an organic light emitting display device. For example, embodiments of the present invention may be applied to a television, a computer monitor, a laptop, a digital camera, a cellular phone, a smart phone, a smart pad, a personal digital assistant (PDA), a portable multimedia player (PMP), a MP3 player, a navigation system, a game console, and/or a video phone, etc.

The foregoing is illustrative of some exemplary embodiments of the present invention and is not intended to be construed as limiting the invention. Although some exemplary embodiments have been described, those skilled in the art will readily appreciate that many modifications are possible without materially departing from the novel teachings and aspects of the present invention. Accordingly, all such modifications are intended to be included within the scope of the present invention as defined in the claims and equivalents thereof. Therefore, it is to be understood that the foregoing is illustrative of various example embodiments and is not to be construed as limited to the specific example embodiments disclosed, and that modifications to the disclosed example embodiments are intended to be included within the scope of the appended claims and equivalents thereof.

What is claimed is:

1. A display panel comprising:
a first substrate having a display unit;
a second substrate opposing the first substrate;
a metal mesh layer disposed on the first substrate and having a mesh shape in a top view;
an insulation layer on the first substrate and having a plurality of openings corresponding to the mesh shape of the metal mesh layer; and
a sealing member disposed between the metal mesh layer and the second substrate in a cross-sectional view,
wherein the sealing member surrounds the display unit having a plurality of pixels, and
wherein the metal mesh layer is on the insulation layer.

2. The display panel of claim 1, further comprising:
a first insulation layer on the first substrate; and
a first metal layer on the first insulation layer, the first metal layer including a same material as a gate electrode in the display unit, wherein the insulation layer having the plurality of openings comprises a second insulation layer on the first metal layer
wherein the metal mesh layer is on the second insulation layer.

3. The display panel of claim 2, wherein the metal mesh layer comprises:
a second metal layer including a same material as at least one of a source electrode or a drain electrode in the display unit; and
a third metal layer on the second metal layer, the third metal layer including a same material as at least one of an anode electrode or a cathode electrode in the display unit.

4. The display panel of claim 2, wherein at least a portion of the metal mesh layer is connected to the first metal layer.

5. The display panel of claim 2, wherein at least one of the first insulation layer, the first metal layer, or the second insulation layer has the mesh shape.

6. The display panel of claim 2, wherein at least one of the first insulation layer, the first metal layer, the second insulation layer, or the metal mesh layer has a step difference.

7. The display panel of claim 2, wherein the first metal layer includes at least one material selected from the group consisting of aluminum (Al), molybdenum (Mo), chromium (Cr), tungsten (W), copper (Cu), gold (Au), silver (Ag), and nickel (Ni).

8. The display panel of claim 2, wherein the metal mesh layer is spaced apart from an edge of the first metal layer by a distance.

9. The display panel of claim 2, wherein the first insulation layer includes a first layer including a same material as a buffer layer in the display unit, and a second layer including a same material as a gate insulation layer in the display unit.

10. The display panel of claim 1, wherein a line width of the mesh shape is about 3 μm to about 10 μm.

11. The display panel of claim 1, wherein a line spacing of the mesh shape is about 3 μm to about 10 μm.

12. A display panel comprising:
a first substrate having a display unit;
a second substrate opposing the first substrate;
a metal mesh layer disposed on the first substrate and having a mesh shape in a top view; and
a sealing member disposed between the metal mesh layer and the second substrate in a cross-sectional view,
wherein the sealing member surrounds the display unit having a plurality of pixels, and
wherein the metal mesh layer includes a second metal layer that includes a same material as at least one of a source electrode or a drain electrode in the display unit, or a third metal layer that includes a same material as at least one of an anode electrode or a cathode electrode in the display unit.

13. The display panel of claim 12, wherein the second metal layer includes at least one material selected from the group consisting of aluminum, molybdenum, chromium, tungsten, copper, gold, silver, and nickel.

14. The display panel of claim 12, wherein a thickness of the second metal layer is about 0.3 μm to about 0.7 μm.

15. The display panel of claim 12, wherein the third metal layer includes at least one material selected from the group consisting of indium tin oxide (ITO), indium zinc oxide (IZO), and silver.

16. The display panel of claim 12, wherein a thickness of the third metal layer is about 0.1 μm to about 0.5 μm.

17. An organic light emitting display device comprising:
a display panel having a plurality of pixels;
a scan driving unit configured to provide a scan signal to the pixels;
a data driving unit configured to provide a data signal to the pixels; and
a timing control unit configured to control the scan driving unit and the data driving unit,
wherein the display panel comprises:
a first substrate having a display unit;
a second substrate opposing the first substrate;
a metal mesh layer disposed on the first substrate and having a mesh shape in a top view;
an insulation layer on the first substrate and having a plurality of openings corresponding to the mesh shape of the metal mesh layer; and
a sealing member disposed between the metal mesh layer and the second substrate in a cross-sectional view, the sealing member surrounding the display unit having the pixels,
wherein the metal mesh layer is on the insulation layer.

18. The device of claim 17, wherein the metal mesh layer comprises:
a second metal layer including a same material as at least one of a source electrode or a drain electrode in the display unit; and
a third metal layer on the second metal layer, the third metal layer including a same material as at least one of an anode electrode or a cathode electrode in the display unit.

19. The device of claim 17, wherein the display panel further comprises:
a first insulation layer on the first substrate;
a first metal layer on the first insulation layer, the first metal layer including a same material as a gate electrode in the display unit,
wherein the insulation layer having the plurality of openings comprises a second insulation layer on the first metal layer, and
wherein at least one of the first insulation layer, the first metal layer, or the second insulation layer has the mesh shape.

* * * * *